(12) United States Patent
Yoneyama

(10) Patent No.: US 10,326,919 B2
(45) Date of Patent: Jun. 18, 2019

(54) METHOD FOR MANUFACTURING ENDOSCOPE IMAGE PICKUP MODULE, ENDOSCOPE IMAGE PICKUP MODULE AND ENDOSCOPE

(71) Applicant: OLYMPUS CORPORATION, Tokyo (JP)

(72) Inventor: Jumpei Yoneyama, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 37 days.

(21) Appl. No.: 15/785,580

(22) Filed: Oct. 17, 2017

(65) Prior Publication Data

US 2018/0109707 A1    Apr. 19, 2018

(30) Foreign Application Priority Data

Oct. 19, 2016  (JP) ................................. 2016-204946
Mar. 22, 2017  (JP) ................................. 2017-056320

(51) Int. Cl.

| | |
|---|---|
| *H01L 31/0232* | (2014.01) |
| *H04N 5/225* | (2006.01) |
| *H01L 27/146* | (2006.01) |
| *G02B 23/24* | (2006.01) |
| *H01L 23/00* | (2006.01) |

(52) U.S. Cl.
CPC ....... *H04N 5/2254* (2013.01); *G02B 23/2484* (2013.01); *H01L 24/14* (2013.01); *H01L 27/14636* (2013.01); *H01L 2224/14155* (2013.01); *H04N 2005/2255* (2013.01)

(58) Field of Classification Search
CPC . H04N 5/2254; H01L 24/14; H01L 27/14636; H01L 2224/14155; G02B 23/2484
See application file for complete search history.

(56) References Cited

U.S. PATENT DOCUMENTS

| | | | | |
|---|---|---|---|---|
| 5,841,128 A | * | 11/1998 | Shibuya ................ | H01L 31/167 250/208.1 |
| 6,909,173 B2 | * | 6/2005 | Hamamoto ......... | H01L 23/4985 257/690 |
| 2007/0109439 A1 | * | 5/2007 | Minamio .......... | H01L 27/14623 348/340 |

(Continued)

FOREIGN PATENT DOCUMENTS

JP    2008-118568 A    5/2008

*Primary Examiner* — Calvin Y Choi

(74) *Attorney, Agent, or Firm* — Scully, Scott, Murphy & Presser, P.C.

(57) ABSTRACT

A method for manufacturing an endoscope image pickup module includes a process of creating a transparent plate with support plates in which the support plates are disposed on side faces of cover glass, a first resin disposing process of disposing uncured first resin in a light receiving section of an image pickup device, a process of fixing a jig to the support plates, a positioning process of arranging the transparent plate with support plates on the image pickup device so that the cover glass covers the light receiving section but does not cover connection electrodes, a process of radiating UV light from above a first principal surface of the cover glass and curing the first resin and a process of separating the support plates from the transparent plate with support plates.

15 Claims, 14 Drawing Sheets

(56) References Cited

U.S. PATENT DOCUMENTS

| | | | |
|---|---|---|---|
| 2007/0210399 A1* | 9/2007 | Lee ................... | H01L 27/14618 257/434 |
| 2012/0002133 A1* | 1/2012 | Yamazaki .............. | G09G 3/342 349/61 |
| 2012/0250330 A1* | 10/2012 | Kelly ............... | B29D 11/00596 362/308 |
| 2015/0014805 A1* | 1/2015 | Yamada ............... | H04N 5/2254 257/443 |

* cited by examiner

METHOD FOR MANUFACTURING ENDOSCOPE IMAGE PICKUP MODULE, ENDOSCOPE IMAGE PICKUP MODULE AND ENDOSCOPE

CROSS-REFERENCE TO RELATED APPLICATI

This application is based upon and claims the benefit of priority from the prior Japanese Patent Applications No. 2016-204946 filed in Japan on Oct. 19, 2016 and No. 2017-056320 filed in Japan on Mar. 22, 2017; the entire contents of which are incorporated herein by reference.

BACKGROUND OF THE INVENTION

1. Field of the Invention

The present invention relates to a method for manufacturing an endoscope image pickup module to bond a transparent plate to a light receiving surface of an image pickup device via an adhesion layer made of UV curable resin, an endoscope image pickup module in which a transparent plate is bonded to a light receiving surface of an image pickup device via an adhesion layer made of UV curable resin, and an endoscope including the endoscope image pickup module.

2. Description of the Related Art

Endoscope image pickup modules are used, disposed at a distal end portion of an electronic endoscope. Reducing endoscope diameter is an important issue in achieving minimal invasiveness and image pickup modules are required to be compact.

First, a wafer level packaging (WLP) type image pickup module will be described briefly. The WLP type image pickup module is manufactured by cutting into individual pieces a junction wafer in which an image pickup wafer including a plurality of image pickup devices and a glass wafer are bonded together. For this reason, a whole light receiving surface on which a light receiving section of the image pickup device is formed is covered with cover glass. The light receiving section of the image pickup device is connected to a connection electrode on a back side facing the light receiving surface via through wiring.

Japanese Patent Application Laid-Open Publication No. 2008-118568 discloses an image pickup module in which cover glass covering a light receiving section does not cover connection electrodes arrayed on a light receiving surface. In this image pickup module, no through wiring needs to be formed unlike a WLP type image pickup module.

In order to perform accurate positioning so as to cover the light receiving section and so as not to cover the connection electrode and bond the cover glass to the image pickup device, it is necessary to fix a jig to the cover glass first. When the cover glass is thin, it is not easy to fix the jig to a side face of the cover glass, and so a suction jig is used which holds the cover glass by suctioning a top surface of the cover glass.

SUMMARY OF THE INVENTION

A method for manufacturing an endoscope image pickup module according to an embodiment of the present invention is a method for manufacturing an endoscope image pickup module to bond a transparent plate to a light receiving surface having a light receiving section and connection electrodes of an image pickup device via an adhesion layer made of UV curable resin, the method including a process of creating a transparent plate with support plates of creating a transparent plate with support plates in which the support plates are disposed on side faces of the transparent plate from a transparent wafer including a first principal surface and a second principal surface facing the first principal surface, a process of disposing transparent first resin, which is the UV curable resin uncured, on at least one of the light receiving section of the image pickup device and the second principal surface of the support plates, a jig fixing process of fixing a jig to the first principal surface of the support plates of the transparent plate with support plates, a positioning process of arranging the second principal surface of the transparent plate on the light receiving surface using the jig so as to cover the light receiving section of the image pickup device and so as not to cover the connection electrodes, a UV light radiation process of radiating UV light from above the first principal surface of the transparent plate and curing the first resin, and a support plate separation process of separating the support plates from the transparent plate with support plates.

An endoscope image pickup module according to another embodiment is an endoscope image pickup module including an image pickup device, a light receiving surface of which includes a light receiving section and connection electrodes, and a transparent plate including a first principal surface and a second principal surface facing the first principal surface, the second principal surface of the transparent plate being bonded to the light receiving surface of the image pickup device via an adhesion layer made of UV curable resin, in which the transparent plate covers the light receiving section but does not cover the connection electrodes, and of four side faces of the transparent plate, side faces in a direction orthogonal to a direction in which the connection electrodes are arrayed are at least partially covered with resin.

An endoscope according to a further embodiment includes an endoscope image pickup module including an image pickup device, a light receiving surface of which includes a light receiving section and connection electrodes, and a transparent plate including a first principal surface and a second principal surface facing the first principal surface, the second principal surface of the transparent plate being bonded to the light receiving surface of the image pickup device via an adhesion layer made of UV curable resin, in which the transparent plate covers the light receiving section but does not cover the connection electrodes, and of four side faces of the transparent plate, side faces in a direction orthogonal to a direction in which the connection electrodes are arrayed are at least partially covered with resin.

DETAILED DESCRIPTION OF THE PREFERRED EMBODIMENTS

<First Embodiment>
<Configuration of Endoscope Image Pickup Module>

Figure 1:
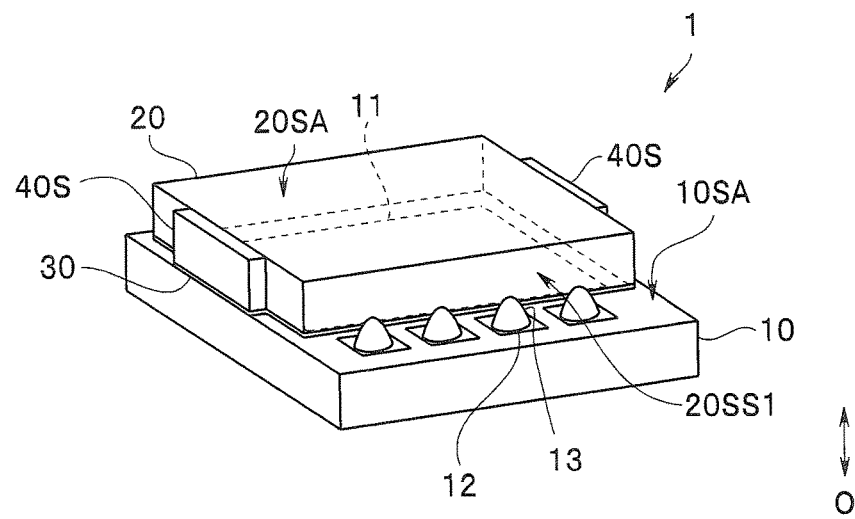
FIG. 1 is a perspective view of an image pickup module according to a first embodiment.
Figure 2A:
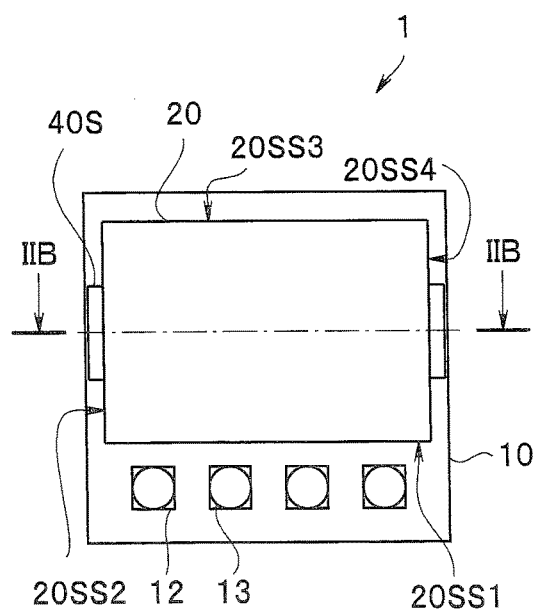
FIG. 2A is a top view of the image pickup module according to the first embodiment.
Figure 2B:
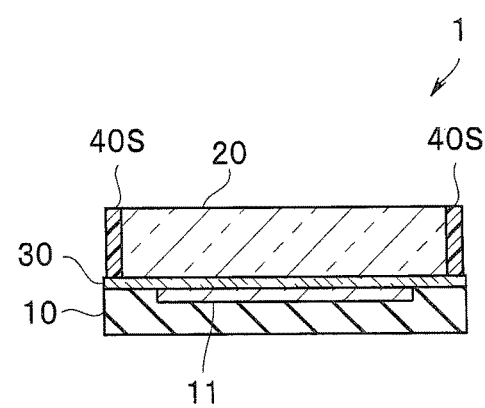
FIG. 2B is a cross-sectional view of the image pickup module of the first embodiment along a line IIB-IIB in FIG. 2A.

As shown in FIG. 1, FIG. 2A and FIG. 2B, the endoscope image pickup module 1 of the present embodiment (hereinafter referred to as "image pickup module 1") includes an image pickup device 10, a cover glass 20, which is a transparent plate and an adhesion layer 30 that bonds the image pickup device 10 and the cover glass 20.

It should be noted that all the drawings are schematic ones, a relationship between thickness and width of each part, thickness ratios among respective parts or the like are different from actual ones, and parts differing in dimensional relationships or ratios among the drawings may be included. Moreover, illustrations of some components may be omitted.

The image pickup device 10 having a light receiving surface 10SA on which a light receiving section 11 is formed is a rectangular parallelepiped semiconductor element having a rectangular cross section in a direction orthogonal to an optical axis O. The image pickup device 10 having a thickness of 150 µm is created by cutting an image pickup wafer 10W including a plurality of image pickup devices 10 (see FIG. 7).

A plurality of connection electrodes 12 connected to the light receiving section 11 are arrayed parallel to a side face of the image pickup device 10 on the periphery of the light receiving section 11 of the light receiving surface 10SA of the image pickup device 10. A bump 13 is disposed in each connection electrode 12. Note that a direction in which the plurality of connection electrodes 12 are arrayed is referred to as a "lateral direction" and a direction orthogonal to an array direction is referred to as a "longitudinal direction". For example, the plurality of connection electrodes 12 are arrayed parallel to a lateral side face.

The cover glass 20, which is a transparent plate, is bonded to the light receiving surface 10SA of 4 mm$^2$ or less of the image pickup device 10, for example, via the adhesion layer 30 made of transparent resin. The light receiving surface 10SA is 2.0 mm wide and 1.8 mm long (area: 3.6 mm$^2$). A top surface 20SA which is a first principal surface of the cover glass 20 is 1.5 mm wide, 1.5 mm long (area: 2.25 mm$^2$) and 150 µm thick so as to fall within a projection plane of the image pickup device 10 in the optical axis direction and so as not to cover the connection electrodes 12.

The cover glass 20 that protects the light receiving section 11 is precisely positioned and bonded via the adhesion layer 30 so as to completely cover the light receiving section 11 and so as not to cover the connection electrodes 12. Note that the transparent plate may be an optical function member such as a resin plate or lens.

The adhesion layer 30, which is UV curable resin, is subjected to curing treatment through UV light irradiation from the top surface 20SA of the cover glass 20.

Since the image pickup module 1 of the present embodiment is manufactured using a manufacturing method, which will be described later, side faces (longitudinal side faces) 20SS2 and 20SS4 orthogonal to side faces (lateral side faces) 20SS1 and 20SS3 in an array direction of the connection electrodes 12 of the cover glass 20 are partially covered with second resin 40S. The second resin 40S is part of second resin 40 of a transparent plate with support plates 20S (see FIG. 8) used when the cover glass 20 is disposed.

Here, the method for bonding the cover glass via the adhesion layer made of UV curable resin provides excellent workability. However, when the image pickup device is ultra-small, that is, when the cover glass is ultra-small, most of the top surface of the cover glass is covered with a suction jig. For this reason, it is not easy to radiate UV light from the top surface of the cover glass.

For example, in order to perform curing treatment by radiating UV light from a side face of the cover glass, UV light is radiated from different directions in several times. A distribution may then appear in a cured state. When a curing distribution occurs, stress during curing may cause movement of the cover glass or a distribution in a refractive index of the adhesion layer, resulting in degradation of characteristics of the image pickup module.

In the image pickup module 1, the cover glass 20 and the second resin 40S are arranged inside the light receiving surface 10SA of the image pickup device 10. In other words, the external dimension (size in a plan view) of the image pickup module 1 in the direction orthogonal to the optical axis corresponds to the external dimension (size in a plan view) of the image pickup device 10. For this reason, the image pickup module 1 is small-sized in the direction orthogonal to the optical axis. Furthermore, since the image pickup module 1 is manufactured using a method, which will be described later, the image pickup module 1 is easily manufactured, and since a refractive index distribution of the adhesion layer 30 is small, the image pickup module 1 exhibits high performance.

<Method for Manufacturing Endoscope Image Pickup Module>

Figure 3:
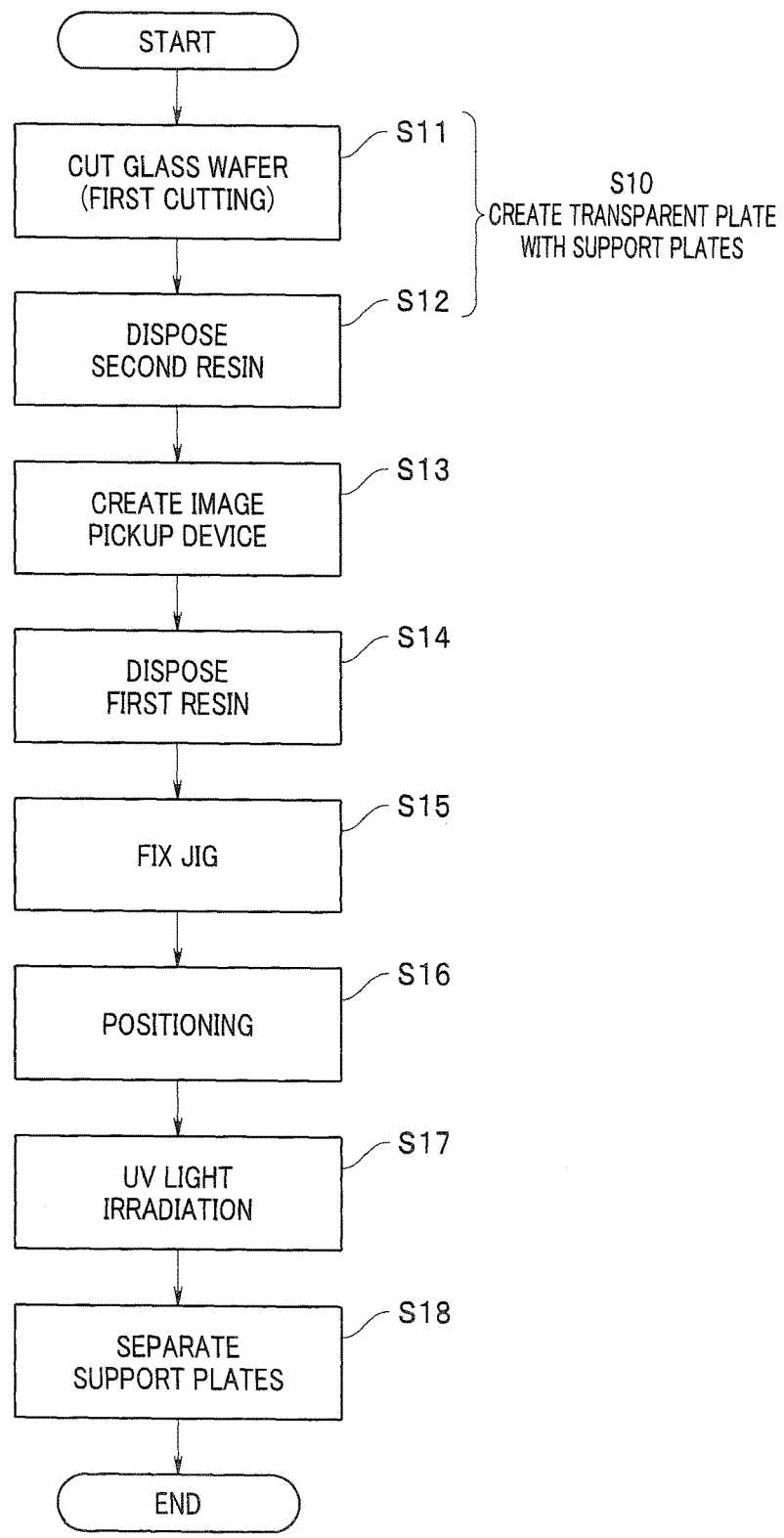
FIG. 3 is a flowchart of a method for manufacturing the image pickup module of the first embodiment.

Next, a method for manufacturing the image pickup module 1 by following a flowchart in FIG. 3.

<Step S11> Glass Wafer Cutting Process (First Cutting Process)

Figure 4:
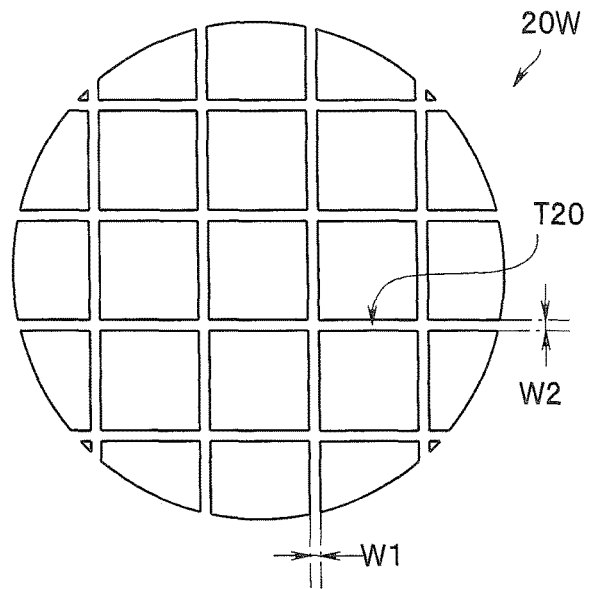
FIG. 4 is a top view of a glass wafer corresponding to the image pickup module of the first embodiment.

As shown in FIG. 4, a glass wafer 20W, which is a transparent wafer, is cut into a plurality of transparent plates (cover glass 20 and support plate 29) by forming "cutting margins" T20 having a width W1. Note that the glass wafer 20W is pasted to a dicing sheet or the like, which is not shown, before cutting. The transparent wafer may be made of transparent resin or the like if its light transmittance is 70% or higher at received light wavelength.

The cutting margin T20 is a through groove formed when glass is lost because of cutting. A width W1 of the cutting margin T20 is slightly larger than a width of a dicing saw or an outer diameter of a dicing wire. For example, by selecting a dicing saw based on the width, the wafer can be cut while forming the cutting margin T20 of a desired width W1.

Although the width W1 of the cutting margin T20 is set as appropriate, W1 is preferably 20 μm or more and 100 μm or less when productivity is taken into consideration. Note that the width W1 of the cutting margin T20 in the longitudinal direction may be different from a width W2 of the cutting margin T20 in the lateral direction.

Note that in the present embodiment, the cover glass 20 and the support plate 29 are transparent plates, identical in shape and size. Therefore, with the cut glass wafer 20W shown in FIG. 4, it is not possible to distinguish between the cover glass 20 and the support plate 29.

<Step S12> Second Resin Disposing Process

The transparent plate with support plates 20S is created which is made up of the transparent plate (cover glass 20) in which the second resin 40 is injected into part of the cutting margin T20 of the glass wafer 20W and the transparent plates (support plates 29) are bonded to both side faces.

Figure 5:
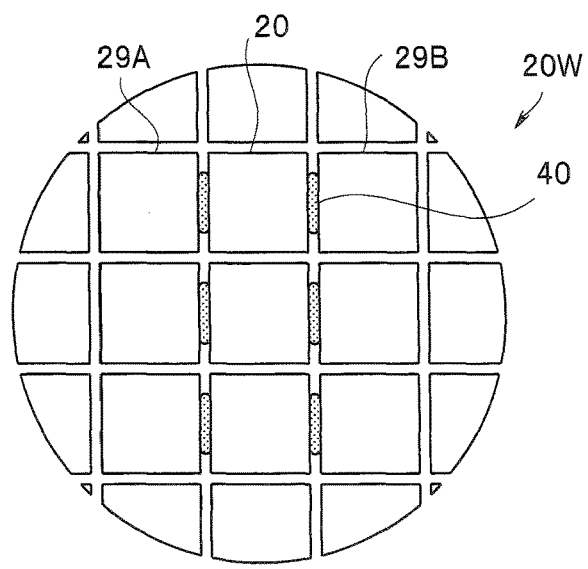
FIG. 5 is a top view of a glass wafer corresponding to the image pickup module of the first embodiment.

That is, as shown in FIG. 5, the second resin 40 is injected into the cutting margin T20 between the cover glass 20 and the support plate 29 using a dispenser or an ink jet method. On the other hand, the second resin 40 is not disposed in a cutting margin between the cover glasses, and a cutting margin between the support plates.

A transparent plate in which the second resin 40 is injected into the cutting margins T20 on both side faces becomes the cover glass 20 and a transparent plate bonded to the cover glass 20 via the second resin 40 becomes the support plate 29.

The second resin 40 may be any one of thermoplastic resin, thermosetting resin and UV curable resin if such resin can bond together the cover glass 20 and the support plate 29.

Figure 6:
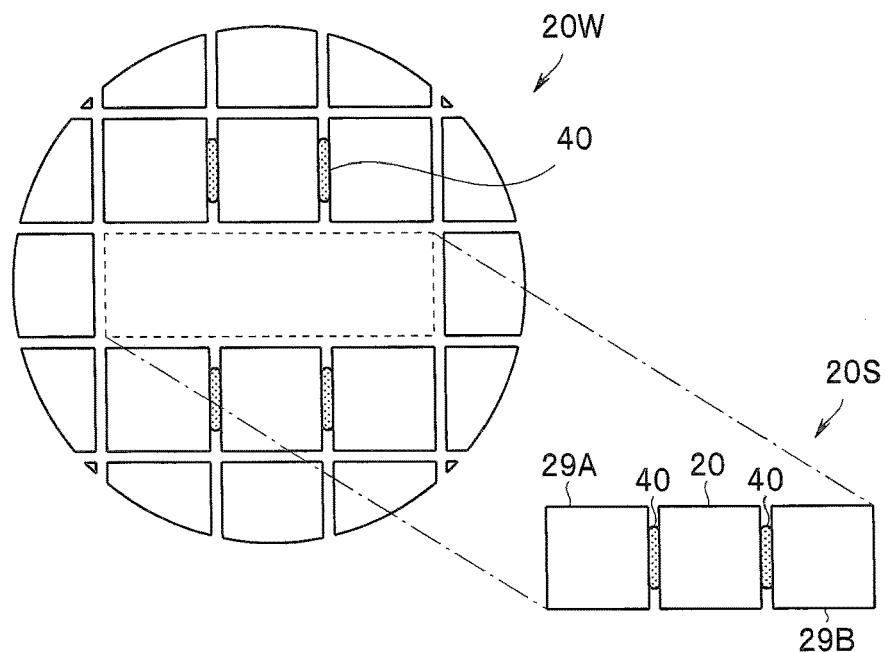
FIG. 6 is a top view of a glass wafer corresponding to the image pickup module of the first embodiment.

When the second resin 40 is thermosetting resin or UV curable resin, curing treatment is performed. As shown in FIG. 6, the transparent plate with support plates 20S made of the cover glass 20, to both side faces facing each other of which support plates 29A and 29B are bonded is removed from a dicing sheet or the like, which is not shown. The dicing sheet loses its adhesive force, for example, by heating or UV light radiation.

Step S11 (first cutting process) and step S12 (second resin disposing process) constitute a process of creating a transparent plate with support plates (step S10) to create a transparent plate with support plates 20S provided with the support plate 29 on the side face of the cover glass 20, which is a transparent plate from the glass wafer 20W, which is a transparent wafer.

<Step S13> Image Pickup Device Creating Process

Figure 7:
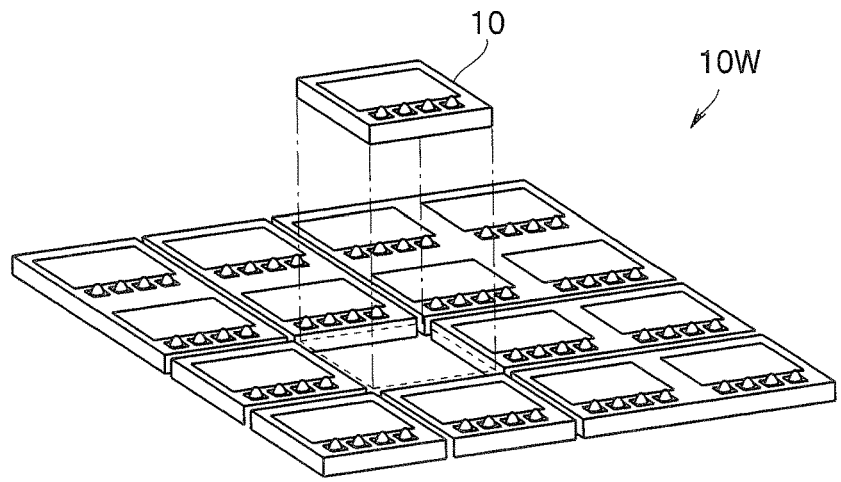
FIG. 7 is a perspective view of an image pickup device wafer corresponding to the image pickup module of the first embodiment.

As shown in FIG. 7, the image pickup wafer 10W having a plurality of light receiving sections or the like is created on the light receiving surface 10SA of a semiconductor wafer made of silicon or the like using a semiconductor manufacturing technique. The image pickup wafer 10W is cut into individual image pickup devices 10. The image pickup device 10 includes the light receiving section 11 made up of a CMOS image sensor or a CCD and the plurality of connection electrodes 12 connected to the light receiving section 11.

<Step S14> First Resin Disposing Process

Figure 8:
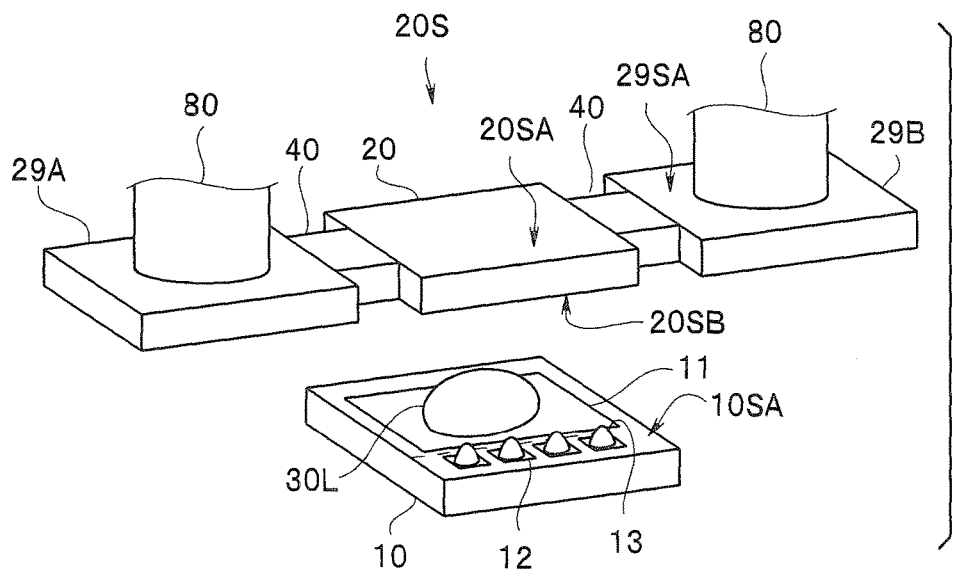
FIG. 8 is a perspective view for describing a method for manufacturing the image pickup module of the first embodiment.

As shown in FIG. 8, transparent UV curable resin, which is uncured first resin 30L, is disposed on the light receiving section 11 of the light receiving surface 10SA of the image pickup device 10 using a dispenser or ink jet method or the like. For the first resin 30L, for example, epoxy-based, acrylic-based or silicone-based UV curable resin can be used. Furthermore, the first resin 30L may be liquid-like or film-like resin.

Note that the first resin 30L may be disposed on an undersurface 20SB, which is a second principal surface of the support plate 29 or disposed on the light receiving section 11 of the image pickup device 10 and the second principal surface 20SB of the support plate 29. That is, the first resin 30L is disposed on at least one of the light receiving section 11 and the second principal surface 20SB of the support plate 29.

<Step S15> Jig Fixing Process

As shown in FIG. 8, a jig 80 for handling is fixed to the support plate 29 of the transparent plate with support plates 20S. That is, two suction portions of the jig 80 are suctioned to respective top surfaces 29SA of the support plates 29A and 29B.

For stable suctioning, a suctioning surface of the jig 80 is preferably 1 mm φ or more.

Note that the order of processes S11 to S15 is not limited to the order shown in FIG. 3. For example, S14 may be executed after S15 or S13 may be executed before S11.

<Step S16> Positioning Process

Positioning is performed in order to bond the cover glass 20 to the light receiving surface 10SA of the image pickup device 10. First, the first principal surface 20SA (second principal surface 20SB) of the cover glass 20 of the transparent plate with support plates 20S held by the jig 80 and the light receiving surface 10SA of the image pickup device 10 are arranged parallel to each other (paralleling). Next, the cover glass 20 is positioned precisely so as to completely cover the light receiving section 11 and so as not to cover the connection electrode 12. The positioning is performed through moving operation of at least one of the transparent plate with support plates 20S and the image pickup device 10.

<Step S17> UV Light Irradiation Process (Curing Process)

Figure 9:
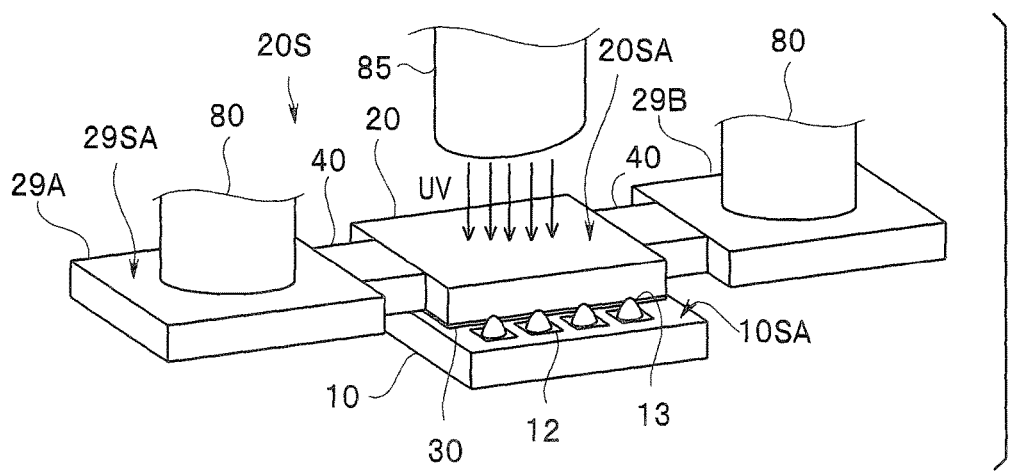
FIG. 9 is a perspective view for describing a method for manufacturing the image pickup module of the first embodiment.

As shown in FIG. 9, UV light is radiated from above the cover glass 20 (top surface 20SA) via, for example, a light guide 85. Then, the first resin 30L is subjected to curing treatment to become the adhesion layer 30 bonding together the cover glass 20 and the image pickup device 10.

Note that the thickness of the cover glass 20, which is a transparent plate, is as small as 300 μm or less, and 150 μm or less and 50 μm or more in particular, and so it is not easy to hold and fix the side face.

According to the manufacturing method of the present embodiment, since the jig 80 is not fixed to the cover glass 20, UV light can be vertically radiated onto the top surface 20SA from above the cover glass 20.

The manufacturing method of the present embodiment performs uniform curing treatment, and can thereby eliminate worries about movement of the cover glass 20 caused by stress during curing or a distribution of refractive index of the adhesion layer 30.

Note that the cover glass 20 and the support plate 29 may have different shapes and different sizes. For example, when the suctioning surface of the jig 80 is large, the size of the support plate 29 may be increased according to the size. Furthermore, a peripheral portion of the glass wafer 20W which cannot be used as the cover glass 20 may be used as the support plate 29. However, causing the cover glass 20 and the support plate 29 to have the same size and the same shape facilitates cutting of the glass wafer 20W and injection of the second resin 40.

The cover glass 20 and the support plate 29 preferably have a rectangular shape in a plan view because this facilitates cutting of the glass wafer 20W. However, in order to make the external size of the image pickup module smaller, the image pickup device 10, the cover glass 20 and the support plate 29 may be cut into polygonal such as hexagonal or octagonal portions.

<Step S18> Support Plate Separation Process

When the second resin 40 of the transparent plate with support plates 20S is cut, the support plates 29A and 29B are separated and the image pickup module 1 shown in FIG. 1 is thereby completed. Cutting is done using a dicing saw or the like having a width of cutting margin of less than W1. Since the image pickup device 10 and the cover glass 20 are not cut, there is no possibility of chipping or the like.

Note that the second resin 40 is preferably cut in such a way that the remaining second resin 40S falls within a space directly above the light receiving surface 10SA for miniaturization of the image pickup module 1.

The method for manufacturing an image pickup module of the present embodiment can efficiently produce small endoscope image pickup modules. The method for manufacturing an image pickup module of the present embodiment demonstrates outstanding effects in manufacturing of an image pickup module by bonding the cover glass 20 having a thickness of 300 μm or less to the small image pickup device 10, the light receiving surface 10SA of which has an area of 4 mm$^2$ or less via the adhesion layer 30 made of UV curable resin in particular.

In other words, as in the case of the image pickup module 1 shown in FIG. 1, when the cover glass having a thickness of 300 μm or less covers the light receiving section of the image pickup device, the light receiving surface of which has an area of 4 mm$^2$ or less and does not cover the connection electrodes, and the lateral side face of the cover glass is covered with resin, such an image pickup module can be deemed as having been manufactured using the manufacturing method of the present embodiment.

<Modifications of First Embodiment>

Next, endoscope image pickup modules 1A and 1B, and methods for manufacturing the respective image pickup modules according to modifications of the first embodiment will be described. The image pickup modules 1A and 1B are similar to the image pickup module 1 and have the same effects. Therefore, components having the same functions are assigned the same reference numerals and description of such components is omitted.

<Modification 1 of First Embodiment>

Figure 10:
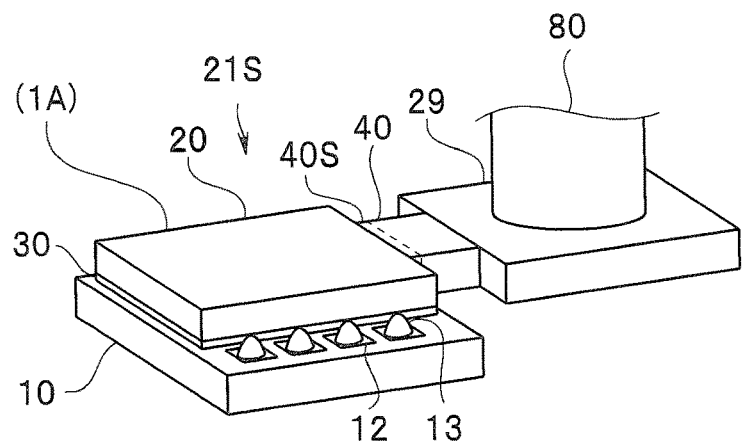
FIG. 10 is a perspective view for describing a method for manufacturing an image pickup module of modification 1 of the first embodiment.

As shown in FIG. 10, according to a method for manufacturing the endoscope image pickup module 1A of modification 1 of the first embodiment, the support plate 29 is bonded to only one lateral side face of the cover glass 20 of a transparent plate with support plates 21S. The jig 80 is fixed to only one support plate 29.

In the image pickup module 1A from which the support plate 29 is separated, part of only one of the four lateral side faces of the cover glass 20 is covered with the second resin 40S.

It is possible to manufacture more image pickup modules 1A from one glass wafer 20W than the image pickup modules 1.

However, as in the case of the method for manufacturing the endoscope image pickup module 1 according to the first embodiment, the method in which the support plates 29A and 29B are bonded to both side faces facing each other of the cover glass 20 of the transparent plate with support plates 20S and the jig 80 is fixed to the two support plates 29A and 29B facilitates positioning of the transparent plate with support plates and the image pickup device, and paralleling in particular, more than the method for manufacturing the image pickup module 1A.

<Modification 2 of First Embodiment>

Figure 11:
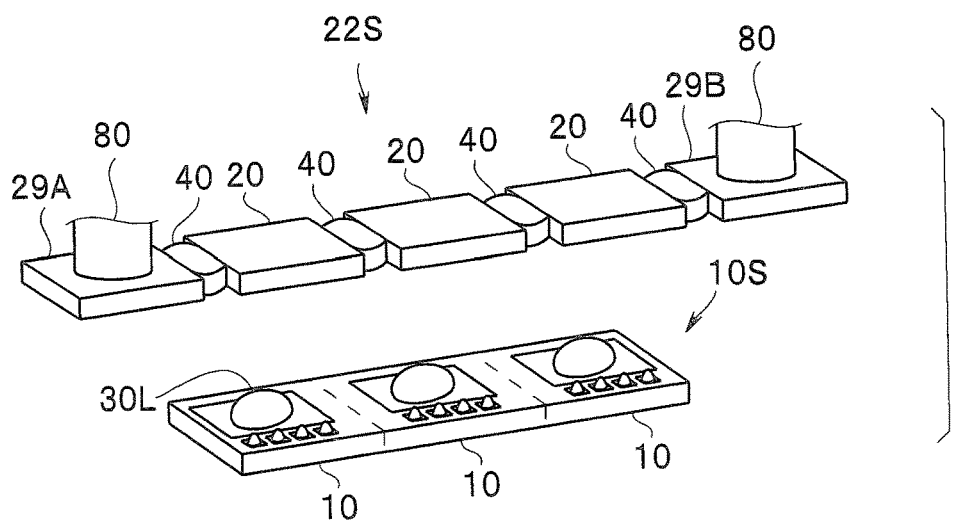
FIG. 11 is a perspective view for describing a method for manufacturing an image pickup module of modification 2 of the first embodiment.

As shown in FIG. 11, in a process of manufacturing an image pickup module 1B, a transparent plate with support plates 22S created in step S12 (process of creating a transparent plate with support plates) is made up of a transparent plate connected body composed of a plurality of pieces of cover glass 20 connected together via the second resin 40 and the support plates 29A and 29B respectively bonded to side faces at both ends of the plurality of pieces of connected cover glass 20 (transparent plate connected body).

Furthermore, in step S13 (image pickup device creating process), an image pickup device connected body (image pickup device bar) 10S including a plurality of image pickup devices 10 is created. In step S16 (positioning process), the transparent plate with support plates (transparent plate connected body) 22S is arranged on the image pickup device connected body 10S.

Figure 12:
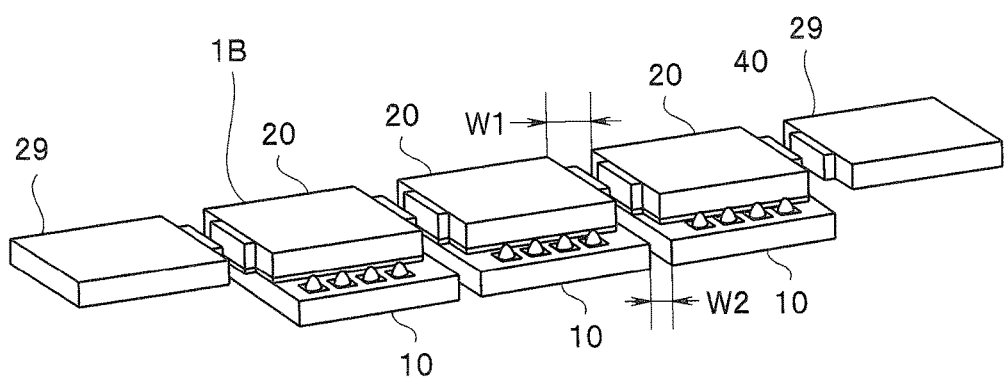
FIG. 12 is a perspective view for describing the method for manufacturing the image pickup module of modification 2 of the first embodiment.

As shown in FIG. 12, in step S18 (support plate separation process), this is divided into individual pieces of a plurality of image pickup modules 1B.

That is, the image pickup device connected body 10S to which the transparent plate with support plates 22S is bonded is pasted to a dicing sheet, which is not shown, or the like. This is cut using a dicing saw or dicing wire according to a dicing method. The width of the dicing saw or the like is selected so that a width W2 of cutting margin is smaller than a width W1 of cutting margin of the glass wafer 20W.

In the image pickup module 1B, the side face of the second resin 40S and the side face of the image pickup device 10 are cut surfaces simultaneously cut in the cutting process. For this reason, the width of the image pickup device 10 is equal to the length between the mutually facing lateral side faces of the two pieces of second resin 40S. In other words, the side face of the second resin 40S and the lateral side face of the image pickup device 10 are of the same cut surface and lie on the same plane.

The method for manufacturing the image pickup module 1B can create the plurality of image pickup modules 1B simultaneously and thereby provides higher productivity than the method for manufacturing the image pickup module 1.

<Second Embodiment>

Next, an endoscope image pickup module 1C and its manufacturing method according to a second embodiment will be described. The image pickup module 1C is similar to the image pickup module 1 or the like and has the same effects. Therefore, components having the same functions are assigned the same reference numerals and description of such components is omitted.

According to a method for manufacturing the image pickup module 1C, the process of creating a transparent plate with support plates (S10) includes a first cutting process (S11), a third resin disposing process and a second separation process. Note that the third resin is the same resin as the second resin, but is named differently for convenience of description.

Figure 13:
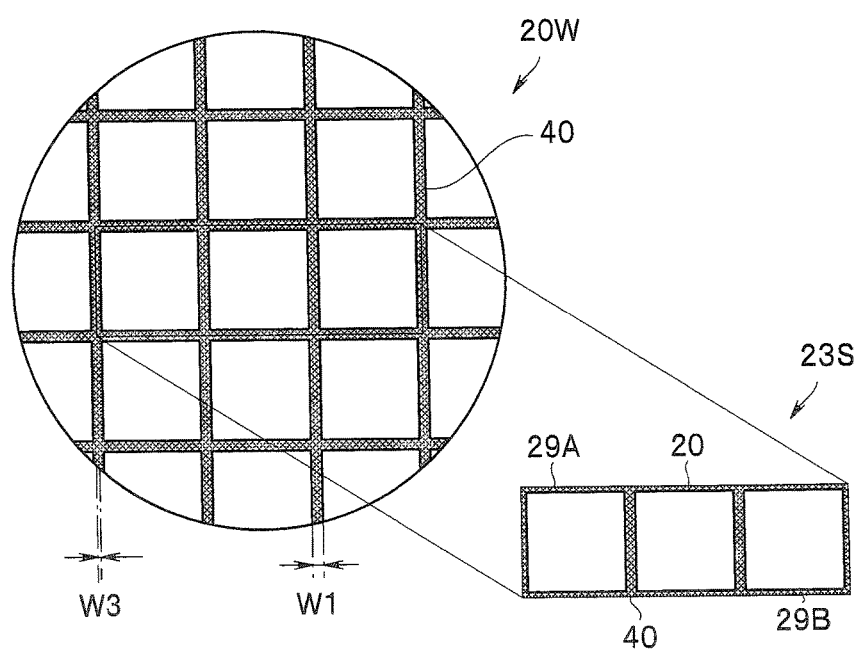
FIG. 13 is a top view of a glass wafer corresponding to an image pickup module of the second embodiment.

As shown in FIG. 13, in the third resin disposing process, the cutting margin having a width of W1 of the glass wafer 20W cut in the first cutting process is filled with third resin 40 without space. That is, for example, the cutting margins between cover glasses are also filled with the third resin 40.

In the third resin disposing process, the glass wafer 20W, the cutting margins of which are filled with the third resin 40 is separated into pieces of transparent plate with support plates 23S in the second separation process.

Figure 14:
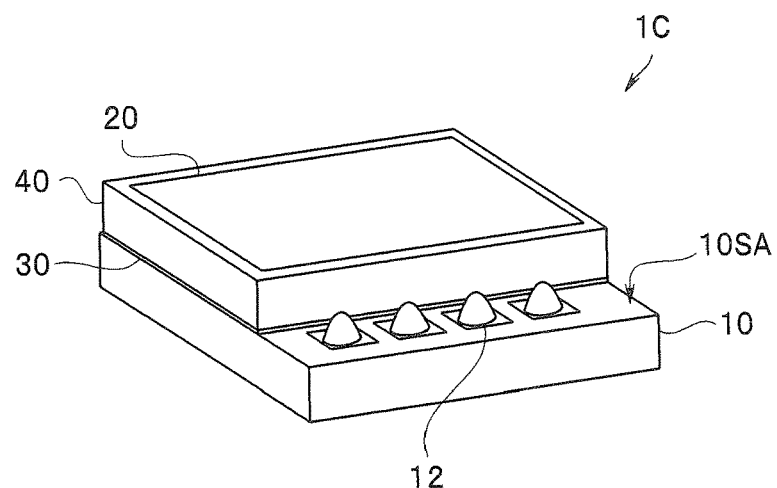
FIG. 14 is a perspective view of the image pickup module of the second embodiment.

In the method for manufacturing the image pickup module 1C, a second separation process is a second cutting process in which the wafer is cut through dicing with a width W3 of cutting margin which is smaller than the width W1 of cutting margin of the glass wafer 20W in the first cutting process. Therefore, as shown in FIG. 14, in the image pickup module 1C, four side faces of the cover glass 20 are covered with the third resin 40.

In the image pickup module 1C, chipping of the cover glass 20 or the like is less likely to occur during handling after completion or the like. Furthermore, there is a possibility that more transparent plates with support plates 23S may be obtained from the glass wafer 20W into which the third resin 40 is injected.

Note that the third resin 40 may be disposed in at least some of the respective cutting margins if it is possible to integrate the plurality of pieces of cover glass 20 and the plurality of support plates 29 of the glass wafer 20W cut in the first cutting process.

Furthermore, the second separation process is not limited to a dicing cutting process if it is possible to separate the transparent plate with support plates 23S from the glass wafer 20W. For example, the third resin 40 may be mechanically broken or part of the third resin 40 may be chemically or physically removed.

<Modifications of Second Embodiment>

Next, endoscope image pickup modules 1D and 1E and their respective manufacturing methods according to modifications of the second embodiment will be described. The image pickup modules 1D and 1E are similar to the image pickup module 1C or the like and have the same effects. Therefore, components having the same functions are assigned the same reference numerals and description of such components is omitted.

<Modification 1 of Second Embodiment>

Figure 15:
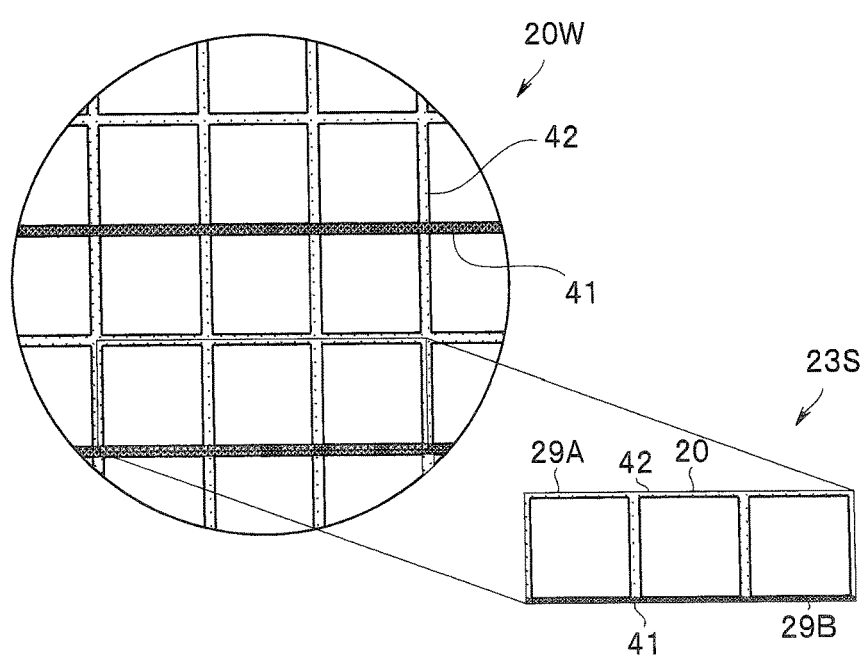
FIG. 15 is a top view of a glass wafer corresponding to an image pickup module according to modification 1 of the second embodiment.

As shown in FIG. 15, according to a method for manufacturing an image pickup module 1D, two types of third resin, that is, insulating resin 41 and conductive resin 42 are disposed in cutting margins of the glass wafer 20W in the third resin disposing process.

Insulating resin 41 is disposed in every other cutting margin in parallel in the lateral direction. Conductive resin 42 having a higher coefficient of thermal conductivity than the coefficient of thermal conductivity of the insulating resin 41 is disposed in other cutting margins.

For example, the conductive resin 42 is resin in which the insulating resin 41 is mixed with minute particles of silicone, metal or the like having a high coefficient of thermal conductivity.

One side face of a transparent plate with support plates 23S is covered with insulating resin and the other three side faces are covered with conductive resin.

Figure 16:
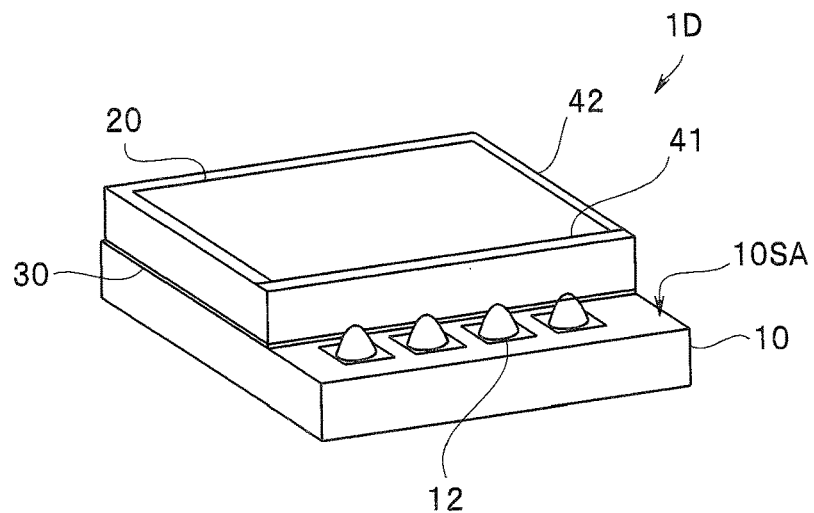
FIG. 16 is a perspective view of the image pickup module according to modification 1 of the second embodiment.

Therefore, as shown in FIG. 16, in the image pickup module 1D, of the four side faces of the cover glass 20, the side face on the connection electrode side is covered with the insulating resin 41 and the other three side faces are covered with the conductive resin 42.

In the image pickup module 1D, heat generated from the image pickup device 10 is transmitted and dissipated via the conductive resin 42 having a high coefficient of thermal conductivity, thus preventing generation of thermal noise or the like. Furthermore, since the side face on the connection electrode side is covered with the insulating resin 41, there is no possibility of short circuits when a wiring board or the like is bonded to the connection electrodes 12.

<Modification 2 of Second Embodiment>

According to a method for manufacturing an image pickup module 1E, two types of dicing (step dicing) with different widths of cutting margin are performed in step S11 (first cutting process). For example, a bottomed groove is formed in the first principal surface 20SA of the glass wafer 20W in a first dicing process with a larger width of cutting margin than W1. Next, the wafer is cut into a plurality of transparent plates (pieces of cover glass 20 and support plates 29) in a second dicing process with a width W1 of cutting margin along the groove.

Figure 17:
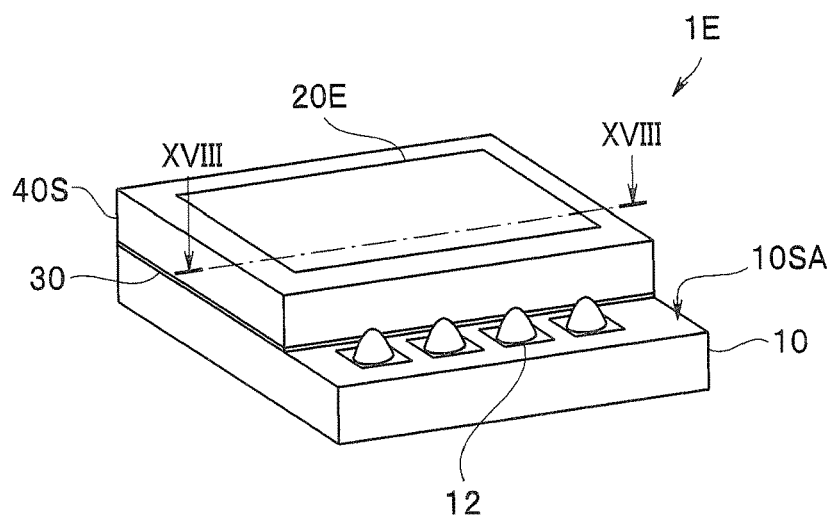
FIG. 17 is a perspective view of an image pickup module according to modification 2 of the second embodiment.
Figure 18:
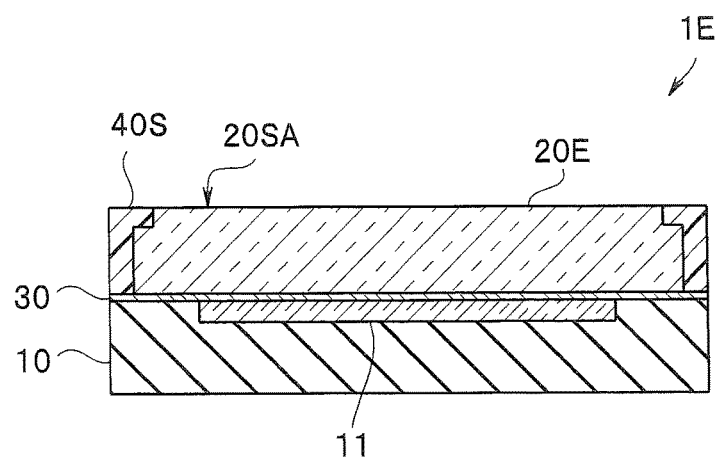
FIG. 18 is a cross-sectional view of the image pickup module according to modification 2 of the second embodiment along a line XVIII-XVIII in FIG. 17.

Therefore, as shown in FIG. 17 and FIG. 18, in the image pickup module 1E, a stepped part (notch) is provided in a peripheral portion of the top surface 20SA of cover glass 20E and the stepped part is filled and covered with third resin 40.

In the image pickup module 1E, chipping or the like of the cover glass 20 is less likely to occur during handling or the like. Note that in order to obtain an image pickup module with a thinner distal end face, the interior of the cover glass 20 may not be completely filled, with only the resin 40S covering the surface of the stepped part.

<Third Embodiment>

According to the manufacturing method of the first embodiment or the like, the glass wafer 20W is cut into the transparent plate (cover glass 20) and the transparent plate (support plate 29), the cut transparent plates are completely separated from each other, and then the second resin (third resin) 40 is disposed in cutting margins, and the transparent plates with support plates 20S to 23S are thereby created.

Figure 19:
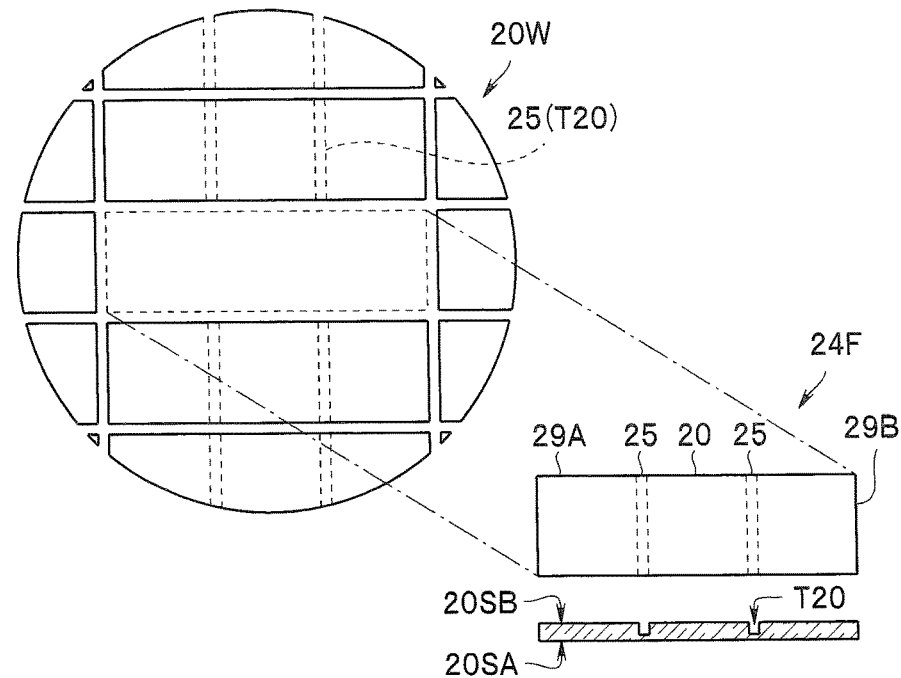
FIG. 19 is a top view of a glass wafer corresponding to an image pickup module according to a third embodiment.

In contrast, as shown in FIG. 19, according to a method for manufacturing an image pickup module 1F of the present embodiment, when transparent plates with support plates are created from the glass wafer 20W, spaces between the transparent plate (cover glass 20) and transparent plates (support plates 29) on both side faces are not completely cut but are left as grooves T20.

That is, according to the method for manufacturing the image pickup module 1F, the process of creating a transparent plate with support plates S10 includes a groove formation process of forming the grooves T20 in the glass wafer 20W, which is a transparent wafer, and a third separation process of separating the transparent plate with support plates 24F from the glass wafer 20W in which the grooves T20 are formed.

As shown in FIG. 19, the grooves T20 are formed in the second principal surface 20SB of the glass wafer 20W in parts constituting lateral side faces of the cover glass 20 and then the transparent plates with support plates 24F are separated in the third separation process.

In the groove formation process of the image pickup module 1F, the third separation process is a third cutting process of cutting the wafer into transparent plates with support plates 24F with a smaller width of cutting margin than the width of the groove T20 along the groove T20.

Figure 20:
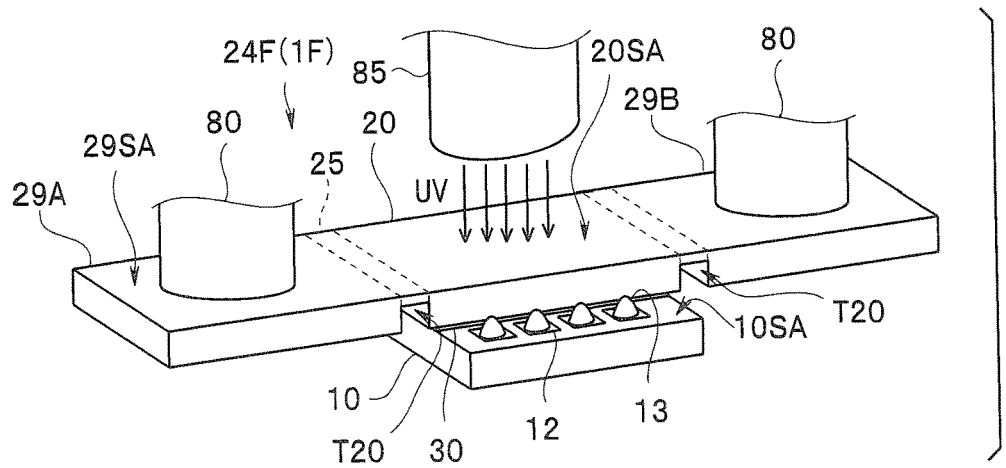
FIG. 20 is a perspective view for describing a method for manufacturing the image pickup module of the third embodiment.

As shown in FIG. 20, the transparent plate with support plates 24F is flipped upside down and bonded to the image pickup device 10.

In the transparent plate with support plates 24F, the transparent plate (cover glass 20) and the transparent plates (support plates 29) on both side faces are connected not via resin but via a groove formation remaining portion 25 made of glass. For this reason, notches are provided on the side faces of the cover glass 20 in the image pickup module 1F.

As shown in FIG. 20, in the transparent plate with support plates 24F of the image pickup module 1F, the spaces between the transparent plate (cover glass 20) and the transparent plates (support plates 29) on both side faces are occupied by the groove formation remaining portions 25, and so this facilitates cutting to separate the support plates 29 from the transparent plate with support plates 24F.

Note that in the image pickup module 1F, the support plate separation process is not limited to the cutting process but may also be a breaking process by bending or laser processing process or the like.

<Modifications of Third Embodiment>

Next, endoscope image pickup modules 1G to 1K and their respective manufacturing methods according to modifications of the third embodiment will be described. The image pickup modules 1G to 1K are similar to the image pickup module 1F and have the same effects. Therefore, components having the same functions are assigned the same reference numerals and description of such components is omitted.

Figure 21A:
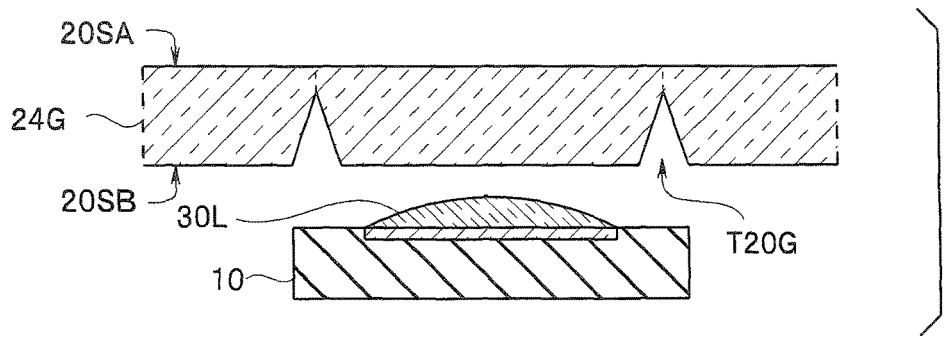
FIG. 21A is a cross-sectional view for describing a method for manufacturing an image pickup module according to modification 1 of the third embodiment.
Figure 21B:
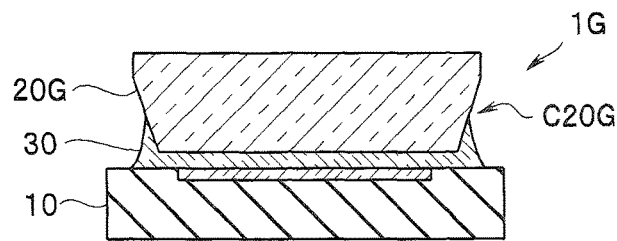
FIG. 21B is a cross-sectional view of the image pickup module according to modification 1 of the third embodiment.

As shown in FIG. 21A and FIG. 21B, in the image pickup module 1G, a groove T20G formed in a transparent plate with support plates 24G has a V-shaped cross section. Support plates can be easily separated from the transparent plate with support plates 24G including the grooves T20G having the V-shaped cross section by, for example, bending the transparent plate with support plates 24G.

Figure 22A:
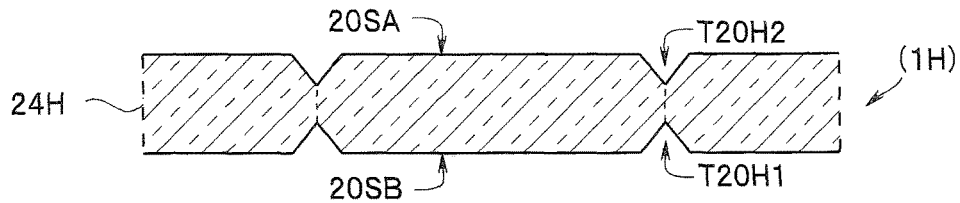
FIG. 22A is a cross-sectional view of a transparent plate with support plates of an image pickup module according to modification 2 of the third embodiment.

As shown in FIG. 22A, grooves T20H1 and 20H2 having V-shaped cross sections are respectively formed in the first principal surface 20SA and the second principal surface 20SB of a transparent plate with support plates 24H of an image pickup module 1H so that bases of the V shape face each other.

Figure 22B:
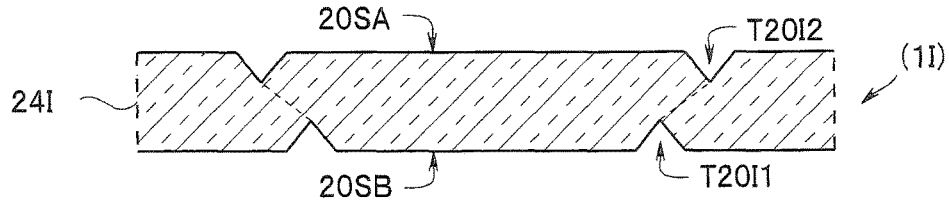
FIG. 22B is a cross-sectional view of a transparent plate with support plates of an image pickup module according to modification 3 of the third embodiment.

As shown in FIG. 22B, grooves T20I1 and 20I2 having V-shaped cross sections are respectively formed in the first principal surface 20SA and the second principal surface 20SB of a transparent plate with support plates 24I of an image pickup module 1I so that bases of the V shape do not face each other.

Figure 22C:
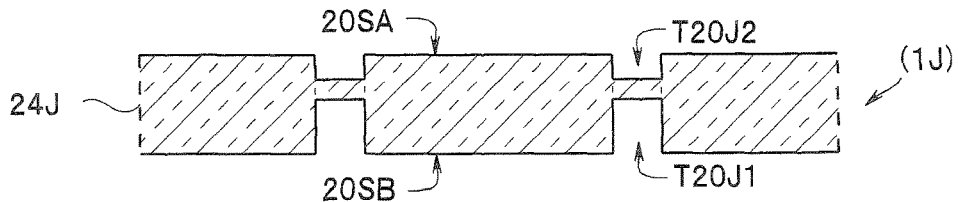
FIG. 22C is a cross-sectional view of a transparent plate with support plates of an image pickup module according to modification 4 of the third embodiment.

As shown in FIG. 22C, grooves T20J1 and 20J2 having rectangular cross sections are formed in the first principal surface 20SA and the second principal surface 20SB of a transparent plate with support plates 24J of an image pickup module 1J so that bases of the rectangle face each other.

That is, the grooves formed in the transparent plate with support plates 24F may have any cross-sectional shape such as V-shape, rectangle-shape or U-shape, if they facilitate separation of the support plates.

Furthermore, the image pickup modules 1H to 1J in which grooves are formed in both sides (the first principal surface and the second principal surface) of the transparent plate with support plates 24F also have the same effects as the effects of the image pickup module 1D.

Figure 23:
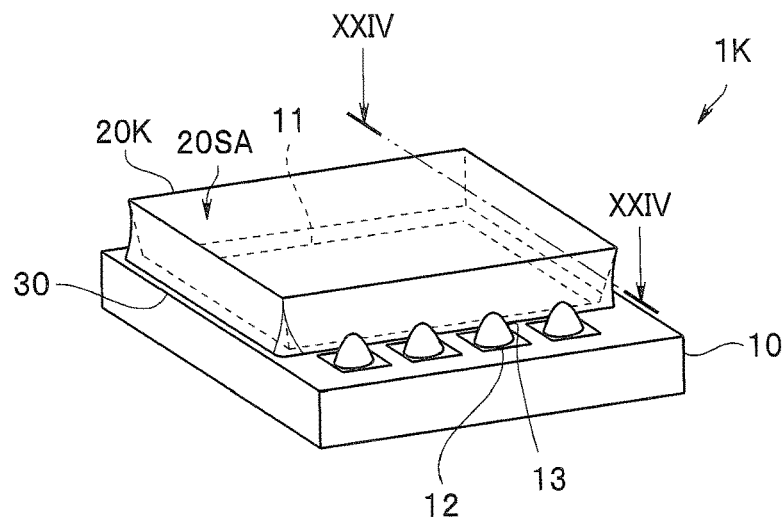
FIG. 23 is a perspective view of an image pickup module according to modification 5 of the third embodiment.
Figure 24:
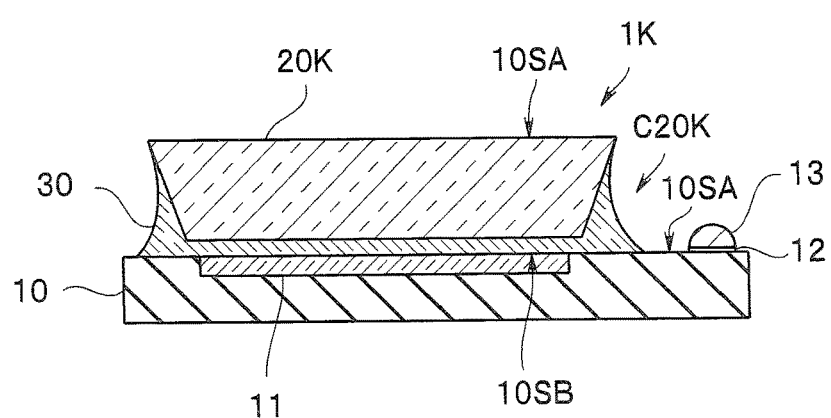
FIG. 24 is a cross-sectional view of the image pickup module according to modification 5 of the third embodiment along a line XXIV-XXIV in FIG. 23.

In an image pickup module 1K shown in FIG. 23 and FIG. 24, grooves are also formed in the lateral side face of the support plate. Alternatively, when the transparent plate with support plates is separated from the glass wafer 20W, the lateral side face is cut using a dicing saw having a V-shaped cross section.

Therefore, a notch C20K is also provided on the lateral side face of the cover glass 20, that is, the side face in the array direction of the connection electrodes 12.

When the cover glass 20 is disposed on the image pickup device 10, part of first resin 30L is pushed out from a bonding surface and spreads over the light receiving surface 10SA around the cover glass 20. If part of the connection electrode 12 is covered with the first resin 30L, a connection failure may occur.

In the image pickup module 1G, the first resin 30L pushed out from the bonding surface is accommodated mostly in the notch C20K through interfacial tension with a wall surface of the notch C20K. This prevents the connection electrodes 12 from being covered with the first resin 30L.

Note that in order to prevent the connection electrodes 12 from being covered with the first resin 30L, the notch C20K may be located at least on the side face in the array direction of the connection electrodes 12 of the lateral side faces facing each other of the cover glass 20. However, if the first resin 30L spread from the side face of the cover glass 20 over the light receiving surface 10SA even reaches the side face of the image pickup device 10, this would cause the external size of the image pickup module to increase. For this reason, the four side faces of the cover glass 20 preferably include notches and the sizes of the notches in the side faces in the array direction of the connection electrodes 12 are more preferably larger than the sizes of notches in other side faces.

<Fourth Embodiment>

Next, an endoscope 9 according to a fourth embodiment will be described.

Figure 25:
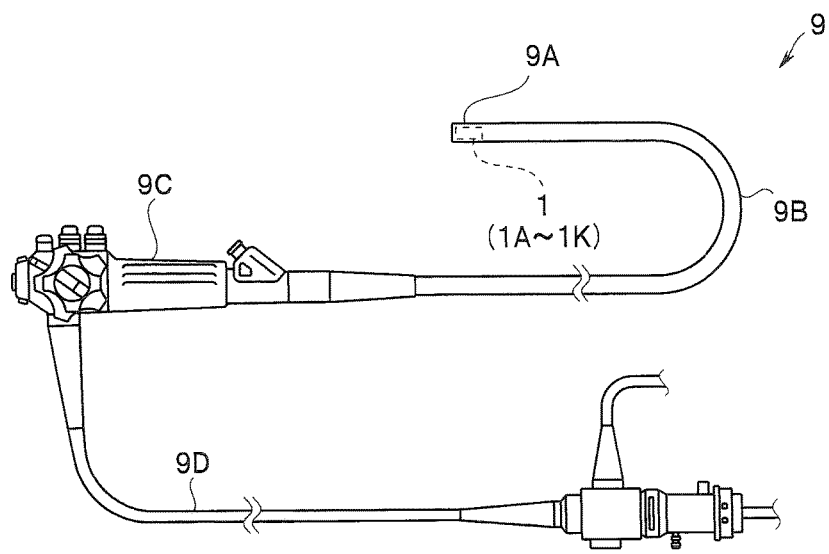
FIG. 25 is a perspective view of an endoscope according to a fourth embodiment.

As shown in FIG. 25, the endoscope 9 includes an insertion portion 9B, at a distal end portion 9A of which the easy-to-manufacture, small image pickup module 1, 1A to 1K is disposed, an operation portion 9C disposed on a proximal end side of the insertion portion 9B and a universal cord 9D that extends from the operation portion 9C. The universal cord 9D is connected to a wiring board (not shown) bonded to the bump 13 of the image pickup module 1.

Since the endoscope 9 includes the small, high characteristic image pickup module 1, 1A to 1K at the distal end portion 9A of the insertion portion 9B, it has a small diameter, high characteristics and is easy to manufacture. Note that although the endoscope 9 is a flexible scope, it may also be a rigid endoscope. Moreover, the endoscope of the embodiment may be of a capsule type or for medical or industrial use if it is provided with the image pickup module 1, 1A to 1K.

As described so far, according to the embodiments of the present invention, it is possible to provide a method for manufacturing an endoscope image pickup module capable of efficiently producing a small endoscope image pickup module, a small endoscope image pickup module manufactured by a high productivity manufacturing method and an endoscope provided with the endoscope image pickup module.

The present invention is not limited only to the embodiments explained above and can be variously modified and carried out in a range not departing from the spirit of the invention.

What is claimed is:

1. A method for manufacturing an endoscope image pickup module, the method comprising:
    forming a transparent plate with at least one support plate in which the at least one support plate is disposed on a side face of the transparent plate, the transparent plate and at least one support plate being formed from a transparent wafer, the transparent plate and at least one support plate each having a first principal surface and a second principal surface facing the first principal surface;
    disposing transparent first resin on at least one of a light receiving section on a light receiving surface of an image pickup device and the second principal surface of the at least one support plate, the transparent first resin being UV curable resin;
    fixing a jig to the first principal surface of the at least one support plate;
    arranging the second principal surface of the transparent plate on the light receiving surface using the jig such that the transparent plate covers the light receiving section of the image pickup device and the transparent plate does not cover connection electrodes of the image pickup device;
    radiating UV light from above the first principal surface of the transparent plate to cure the first resin; and
    separating the at least one support plate from the transparent plate.

2. The method for manufacturing an endoscope image pickup module according to claim 1, wherein the forming of the transparent plate with at least one support plate comprises:
    cutting the transparent wafer into the transparent plate and the at least one support plate; and
    disposing second resin in at least one cutting margin between the transparent plate and the at least one support plate formed by the cutting of the transparent wafer.

3. The method for manufacturing an endoscope image pickup module according to claim 1, wherein the forming of the transparent plate with at least one support plate comprises:
    cutting the transparent wafer into the transparent plate and the at least one support plate;
    disposing second resin in at least one cutting margin formed by the cutting of the transparent wafer; and
    separating the transparent plate from the transparent wafer in which the second resin is disposed in the at least one cutting margin.

4. The method for manufacturing an endoscope image pickup module according to claim 1, wherein the forming of the transparent plate with at least one support plate comprises:
    forming a groove in the transparent wafer; and
    separating the transparent plate from the transparent wafer by cutting along the groove.

5. The method for manufacturing an endoscope image pickup module according to claim 4, wherein the forming of the groove comprises forming the groove in the second principal surface of the transparent wafer.

6. The method for manufacturing an endoscope image pickup module according to claim 1, wherein the transparent plate comprises a transparent plate connected body including a plurality of transparent plates and the at least one support plate is connected to a side face of the transparent plate connected body,
    the transparent plate connected body is arranged on an image pickup device connected body comprising a plurality of image pickup devices corresponding to the plurality of transparent plates, and
    the separating comprises dividing the plurality of image pickup devices and plurality of corresponding transparent plates into a plurality of individual endoscope image pickup modules.

7. The method for manufacturing an endoscope image pickup module according to claim 1, wherein the transparent plate and the at least one support plate have a same size and a same shape.

8. The method for manufacturing an endoscope image pickup module according to claim 1, wherein the light receiving surface is 4 mm$^2$ or less and the transparent plate has a thickness of 300 µm or less.

9. The method for manufacturing an endoscope image pickup module according to claim 1, wherein the fixing comprises fixing the jig to the first principal surface of the at least one support plate such that no portions of the jig interfere with the curing of the transparent first resin through the first principal surface of the transparent plate and the radiating of the UV light from above the first principal surface of the transparent plate cures the first resin without interference by the portions of the jig.

10. The method for manufacturing an endoscope image pickup module according to claim 1, wherein the at least one support plate comprises first and second support plates each disposed on opposite side faces of the transparent plate.

11. An endoscope image pickup module comprising:
    an image pickup device having a light receiving surface, the light receiving surface including a light receiving section and connection electrodes; and
    a transparent plate including a first principal surface and a second principal surface facing the first principal surface, the second principal surface of the transparent plate being bonded to the light receiving surface of the image pickup device via an adhesion layer made of UV curable resin,
    wherein the transparent plate is arranged to cover the light receiving section and not to cover the connection electrodes, and of four side faces of the transparent plate, side faces in a direction orthogonal to a direction in which the connection electrodes are arrayed are at least partially covered with resin.

12. The endoscope image pickup module according to claim 11, wherein the light receiving surface is 4 mm² or less and the transparent plate has a thickness of 300 μm or less.

13. An endoscope comprising the endoscope image pickup module according to claim 11.

14. An endoscope image pickup module comprising:
an image pickup device having a light receiving surface, the light receiving surface including a light receiving section and connection electrodes; and
a transparent plate including a first principal surface and a second principal surface facing the first principal surface, the second principal surface of the transparent plate being bonded to the light receiving surface of the image pickup device via an adhesion layer made of UV curable resin,
wherein the transparent plate is arranged to cover the light receiving section and not to cover the connection electrodes, and
a notch is provided in a side face of the transparent plate.

15. The endoscope image pickup module according to claim 14, wherein the UV curable resin is disposed at the notch in the second principal surface.

* * * * *